(12) United States Patent
Laurino et al.

(10) Patent No.: US 8,755,173 B2
(45) Date of Patent: Jun. 17, 2014

(54) DIGITAL MULTIMETERS INCLUDING A RUGGEDIZED JACKET

(75) Inventors: Ferdinand Laurino, Seattle, WA (US); Duncan Kearsley, Seattle, WA (US)

(73) Assignee: Fluke Corporation, Everett, WA (US)

( * ) Notice: Subject to any disclaimer, the term of this patent is extended or adjusted under 35 U.S.C. 154(b) by 1035 days.

(21) Appl. No.: 12/534,852

(22) Filed: Aug. 3, 2009

(65) Prior Publication Data
US 2011/0026196 A1 Feb. 3, 2011

(51) Int. Cl.
| H05K 5/00 | (2006.01) |
| H05K 7/00 | (2006.01) |
| G06F 1/16 | (2006.01) |
| H01H 3/08 | (2006.01) |
| H01H 19/00 | (2006.01) |
| H01H 19/14 | (2006.01) |
| H01H 21/00 | (2006.01) |
| H01H 3/12 | (2006.01) |
| H01H 13/14 | (2006.01) |

(52) U.S. Cl.
USPC .................. 361/679.01; 200/336; 200/341

(58) Field of Classification Search
USPC ............. 361/679.01, 679.07, 679.27, 679.29; 200/336, 341
See application file for complete search history.

(56) References Cited

U.S. PATENT DOCUMENTS

| D308,832 | S | | 6/1990 | Shields, Jr. et al. |
| D337,435 | S | * | 7/1993 | Kaneko et al. ................. D3/218 |
| D361,949 | S | | 9/1995 | Kim |
| D365,031 | S | | 12/1995 | Kim |
| 5,619,129 | A | | 4/1997 | Kamiya |
| 5,621,311 | A | | 4/1997 | Kamiya |
| 5,625,286 | A | * | 4/1997 | Kamiya ........................ 324/156 |
| D381,280 | S | | 7/1997 | Tomiyama et al. |
| D385,808 | S | | 11/1997 | Kim |
| D401,521 | S | | 11/1998 | Wrisley et al. |

(Continued)

FOREIGN PATENT DOCUMENTS

| CN | 2279612 Y | 4/1998 |
| KR | 30-0291740 S | 2/2002 |
| KR | 30-0371385 S | 1/2005 |
| TW | 377222 | 12/1999 |
| TW | 568532 | 12/2003 |

(Continued)

OTHER PUBLICATIONS

Amprobe® Test Tools, Press Release, "Amprobe HD160C and HD110C Heavy-Duty Digital Multimeters Stand Up to Harsh Environments," 2 pages, May 29, 2007.

(Continued)

*Primary Examiner* — Anthony Haughton
(74) *Attorney, Agent, or Firm* — Christensen O'Connor Johnson Kindness PLLC

(57) ABSTRACT

A digital multimeter includes a display for displaying a measured parameter, a selector for selecting the measured parameter, at least one jack configured to receive a test lead plug, and a housing assembly including the display, the selector and the jack. The selector includes a push button, a rotary selector switch, a knob coupled to the rotary selector switch, and a cover molded over the knob. The cover includes a relatively soft material compared to the knob. The housing assembly includes a first and second housing portions coupled together, a gasket sealing the first and second housing portions, and a jacket overlying parts of the first and second housing portions and the gasket. The housing assembly defines an internal cavity and is configured to absorb impact energy in response to dropping the digital multimeter up to approximately one meter and protect against water and dust ingress into the cavity.

19 Claims, 25 Drawing Sheets

(56) References Cited

U.S. PATENT DOCUMENTS

| | | |
|---|---|---|
| 5,829,651 A | 11/1998 | Luchka |
| D414,125 S | 9/1999 | Chen |
| D419,464 S | 1/2000 | Chang |
| D419,466 S | 1/2000 | McCain |
| D428,349 S | 7/2000 | Pagliara |
| 6,095,682 A * | 8/2000 | Hollander et al. ............ 374/121 |
| D446,463 S | 8/2001 | Chang |
| D446,735 S | 8/2001 | McCain |
| D458,551 S | 6/2002 | Malawista |
| D472,828 S | 4/2003 | Chang |
| D515,952 S | 2/2006 | Chang |
| 7,056,012 B2 | 6/2006 | Blakeley, III |
| 7,109,700 B2 | 9/2006 | Fazzina |
| 7,224,159 B2 | 5/2007 | Van Deursen |
| D555,525 S | 11/2007 | Chong et al. |
| 7,654,857 B2 | 2/2010 | Morey et al. |
| 2004/0012379 A1 * | 1/2004 | Van Deursen et al. ....... 324/72.5 |
| 2008/0023310 A1 * | 1/2008 | Chong et al. ................. 200/336 |
| 2009/0102455 A1 | 4/2009 | Worones |
| 2010/0181990 A1 | 7/2010 | Hudson et al. |

FOREIGN PATENT DOCUMENTS

| | | |
|---|---|---|
| TW | D120932 S | 2/2007 |
| TW | 450720 | 8/2011 |

OTHER PUBLICATIONS

Amprobe® Test Tools, "HD160C Heavy-Duty True-rms Digital Multimeter User Manual," 24 pages, Mar. 2007.
Amprobe® Test Tools, "Model: HD160C Heavy-Duty Digital Multimeter With True-RMS," 4 pages, 2007.
European Patent Application No. 10171790.8, Extended European Search Report, 7 pages, Oct. 22, 2010.
Myron L Company, "Ultrameter™," Transcat, 6 pages, Aug. 6, 2007.
Transcat, "Ultrameter™ Pricing," 1 page, Aug. 6, 2007.
European Patent Application No. 10171790.8, Examination Report, 4 pages, Mar. 13, 2013.
European Examination Report dated Jun. 12, 2013, in European Application No. EP 10 171 790.8, filed Aug. 3, 2010, 4 pages.
Chinese Office Action dated Nov. 29, 2013, in Chinese Application No. 201010243583.2, filed Aug. 30, 2010, 7 pages.

* cited by examiner

DIGITAL MULTIMETERS INCLUDING A RUGGEDIZED JACKET

TECHNICAL FIELD

The present disclosure relates generally to ruggedized digital multimeters. More particularly, the present disclosure relates to a digital multimeter including a ruggedized jacket.

BACKGROUND

Digital multimeters or "DMMs" are adapted for measuring a number of parameters generally needed for service, troubleshooting, and maintenance applications. Such parameters typically include alternating current (a.c.) voltage and current, direct current (d.c.) voltage and current, and resistance or continuity. Other parameters including frequency, capacitance, and temperature may also be measured to meet the requirements of the particular application.

Conventional DMMs include a hard plastic housing or case. These housings support various electrical components for measuring the parameters and electrically insulate these components from an operator.

DMMs are frequently used in environments that may damage a conventional DMM. For example, a conventional DMM may be dropped distances of one meter or less onto a hard surface, e.g., concrete, steel, etc. Such drops may fracture the housings of conventional DMMs. In addition to possibly rendering the conventional DMM inoperable, such drops may compromise the electrical insulation and potentially make it unsafe for the operator to use. DMMs may also be used above liquids such as water. Fluid ingress as a result of being immersed in a liquid may cause irreparable damage to the internal components a conventional DMM.

DETAILED DESCRIPTION

Specific details of embodiments according to the present disclosure are described below with reference to a ruggedized digital multimeter. Other embodiments of the disclosure can have configurations, components, features or procedures different than those described in this section. A person of ordinary skill in the art, therefore, will accordingly understand that the disclosure may have other embodiments with additional elements, or the disclosure may have other embodiments without several of the elements shown and described below with reference to FIGS. 1-25.

FIGS. 1-8 are views of a ruggedized DMM 10 including a DMM 100 and a jacket 200 according to an embodiment of the present disclosure. FIGS. 9-17 are views of the DMM 100 per se and FIGS. 18-25 are views of the jacket 200 per se.

Figure 1:
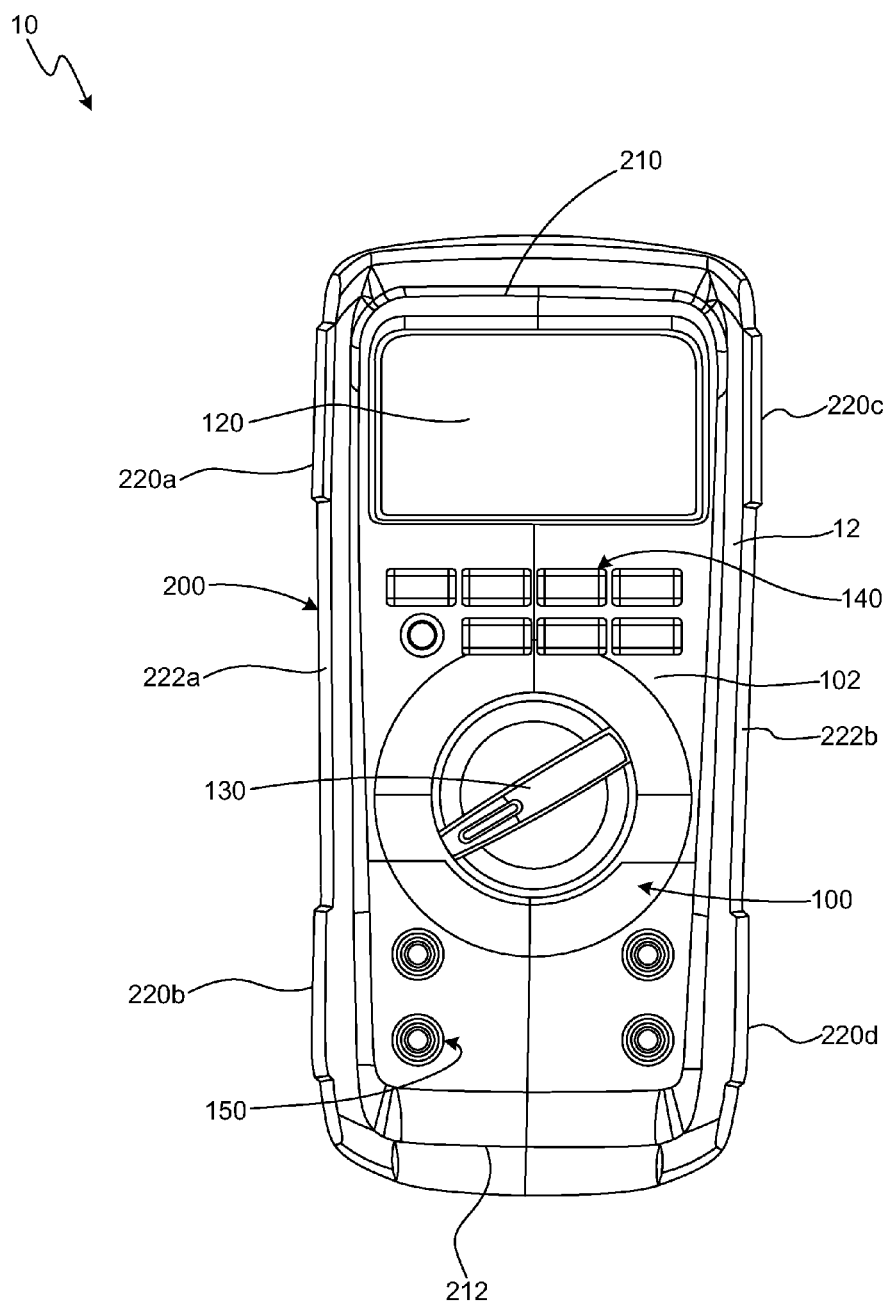
FIG. 1 is front elevation view of a ruggedized digital multimeter (DMM) according to an embodiment of the present disclosure.

FIG. 1 is a front elevation view showing a front face 12 of the ruggedized DMM 10. In particular, the front 12 includes a front face 102 of the DMM 100 surrounded by the jacket 200. As will be discussed in greater detail with respect to FIG. 9, the face 102 includes a display 120, a rotary selector 130, a plurality of push buttons 140, and a plurality of jacks 150.

The jacket 200 includes an upstanding ridge or brow 210 that projects outward from the front face 102 and is positioned adjacent to the display 120. Another upstanding ridge or chin 212 can project outward from the front face 102 and is positioned adjacent to the jacks 150. According to certain embodiments of the present disclosure, the brow 210 and/or the chin 212 may prevent or eliminate contact with the display 120, the rotary selector 130, the push buttons 140, and/or the jacks 150 if the ruggedized DMM 10 falls with the front face 12 oriented downward.

Figure 2:
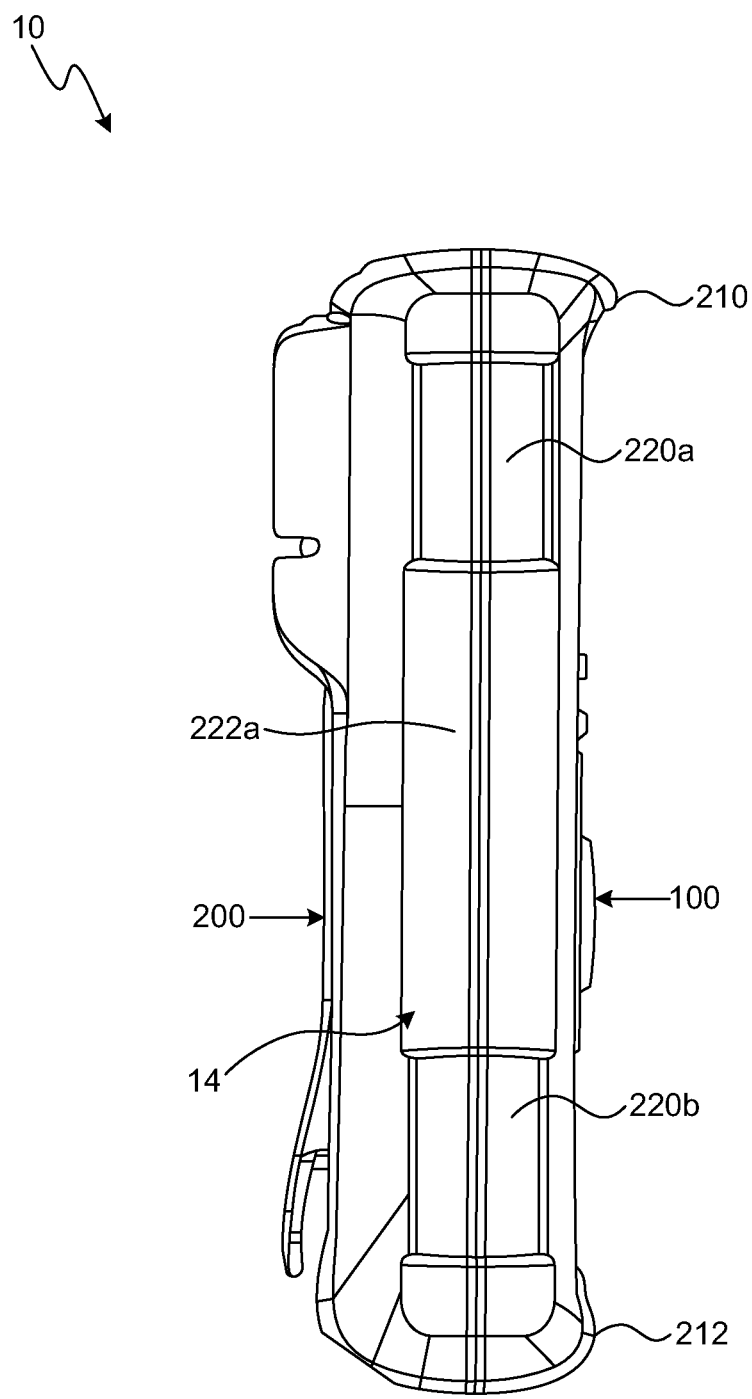
FIG. 2 is a left-side elevation view of the ruggedized DMM shown in FIG. 1.
Figure 3:
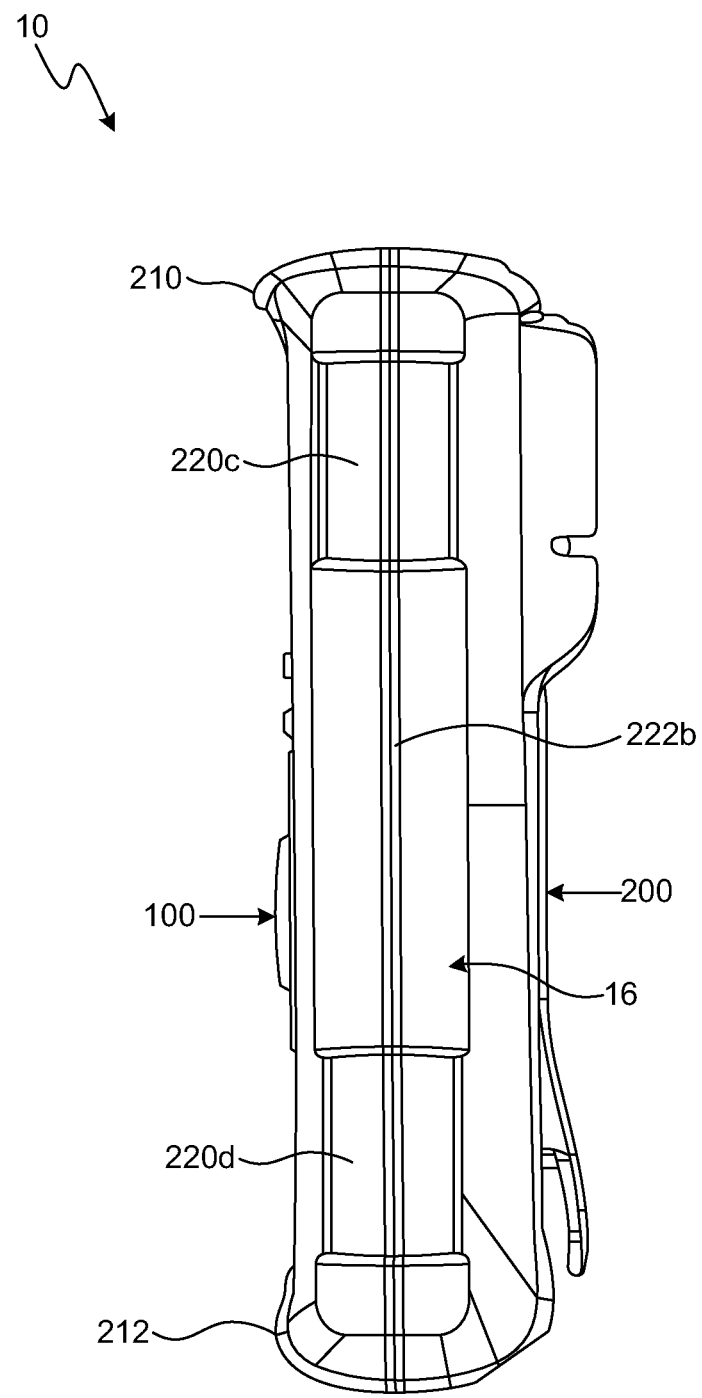
FIG. 3 is a right-side elevation view of the ruggedized DMM shown in FIG. 1.

Referring additionally to FIGS. 2 and 3, grips 220 (four grips 220a-220d are shown in FIG. 1) project laterally outward from the DMM 100. According to certain embodiments of the present disclosure, the grips 220 may initially contact the ground if the ruggedized DMM 10 falls with its left-side 14 (FIG. 2) or its right-side 16 (FIG. 3) oriented downward. Depression 222 (two depressions 222a and 222b are shown in FIG. 1) between each pair of the grips 220 on the left-side 14 or the right-side 16 may facilitate grasping the ruggedized DMM 10 between the fingers and thumb of an operator's hand (not shown). Accordingly, the grips 220 that project above the depressions 222 may provide ledges that deter the ruggedized DMM from sliding through the operator's hand.

Figure 4:
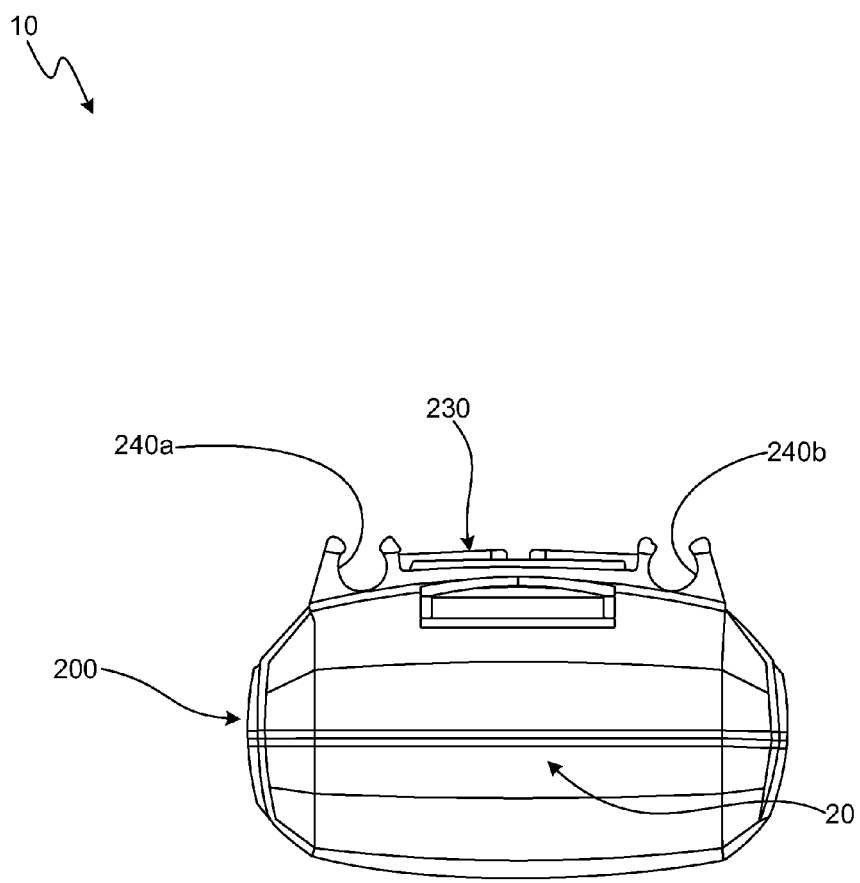
FIG. 4 is a top plan view of the ruggedized DMM shown in FIG. 1.
Figure 5:
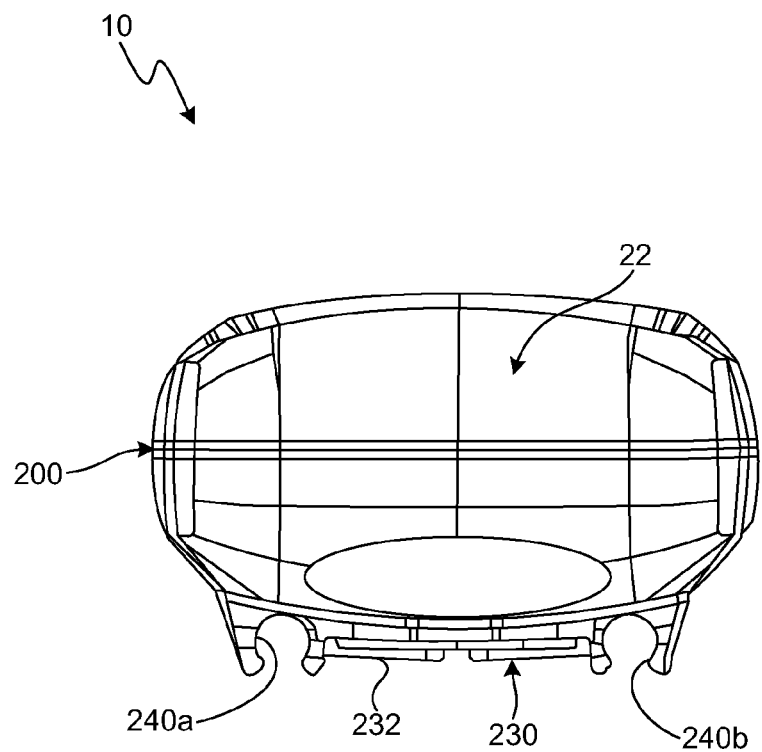
FIG. 5 is a bottom view of the ruggedized DMM shown in FIG. 1.
Figure 6:
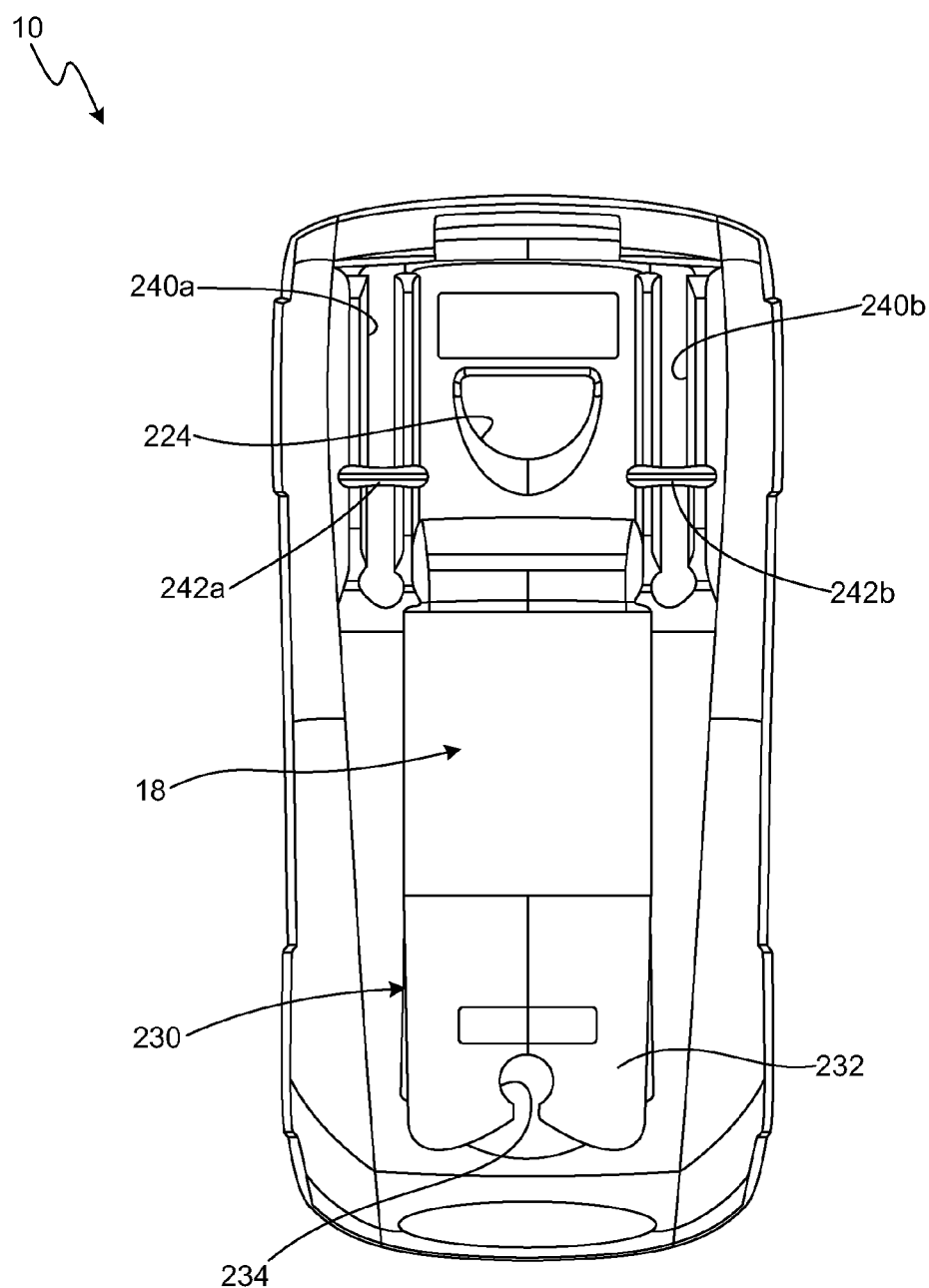
FIG. 6 is a back elevation view of the ruggedized DMM shown in FIG. 1.

Referring additionally to FIGS. 4-6, a back side 18 of the ruggedized DMM 10 may include various fittings and features for supporting the ruggedized DMM 10 or accessories for the ruggedized DMM 10. For example, an aperture 224 in the jacket 200 may provide a receptacle for a mounting bracket (not shown) to support the ruggedized DMM 10. The jacket 200 may include a stand 230 for supporting the ruggedized DMM 10 in a generally upright orientation on a support surface, e.g., a table (not shown). The stand 230 may also include a cable manager 232. The cable manager 232 may include a keyhole shaped opening 234 for passing cords of test leads (not shown). Test lead holders 240 (two test lead holders 240a and 240b are shown in FIGS. 4-6) may be provided for releasably retaining the probes of test leads (not shown) on the ruggedized DMM 10. Slots 242 (slots 242a and 242b are shown in FIG. 6) may accommodate cross guard flares on the test leads (not shown). FIGS. 4 and 5 show the top 20 and bottom 22, respectively, of the ruggedized DMM 10.

Figure 7:
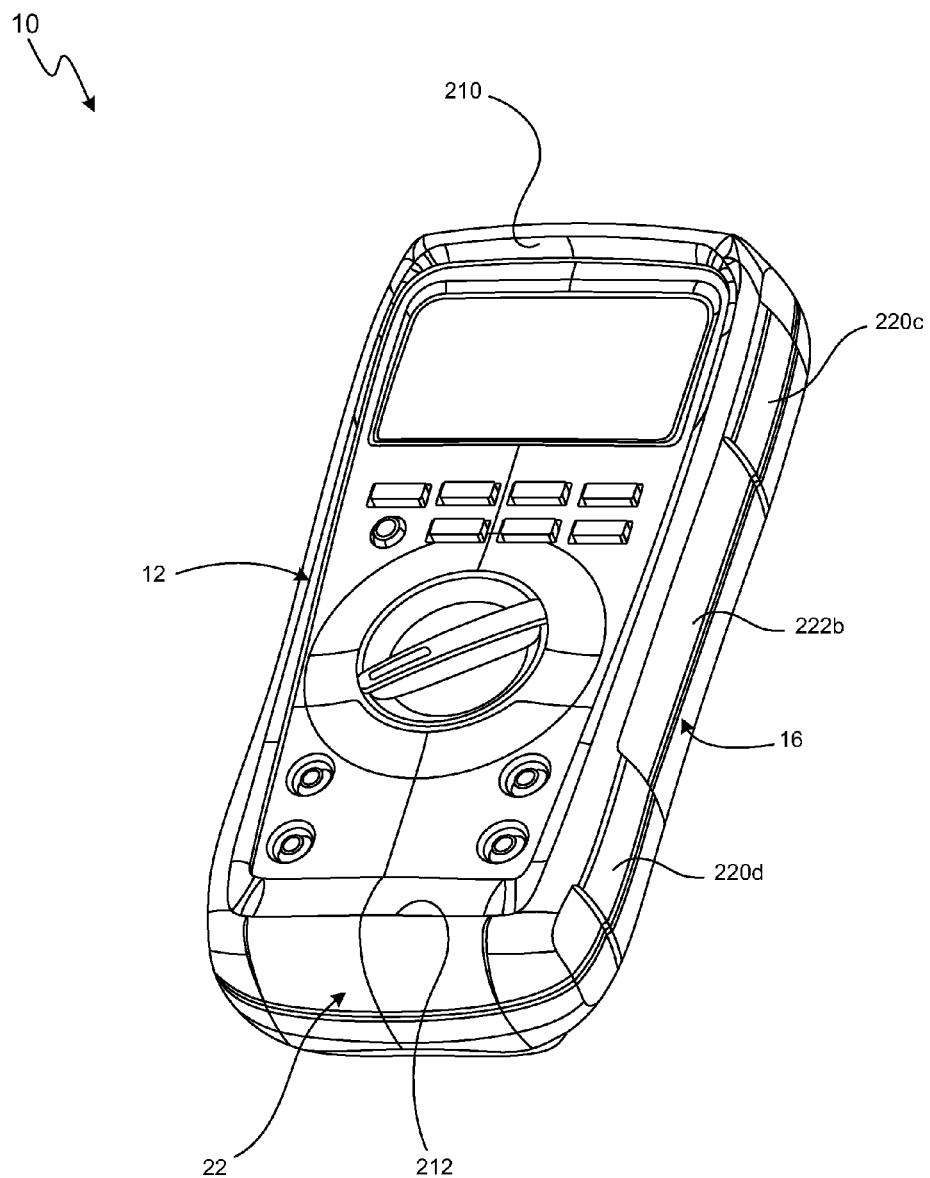
FIG. 7 is a first perspective view of the ruggedized DMM shown in FIG. 1.
Figure 8:
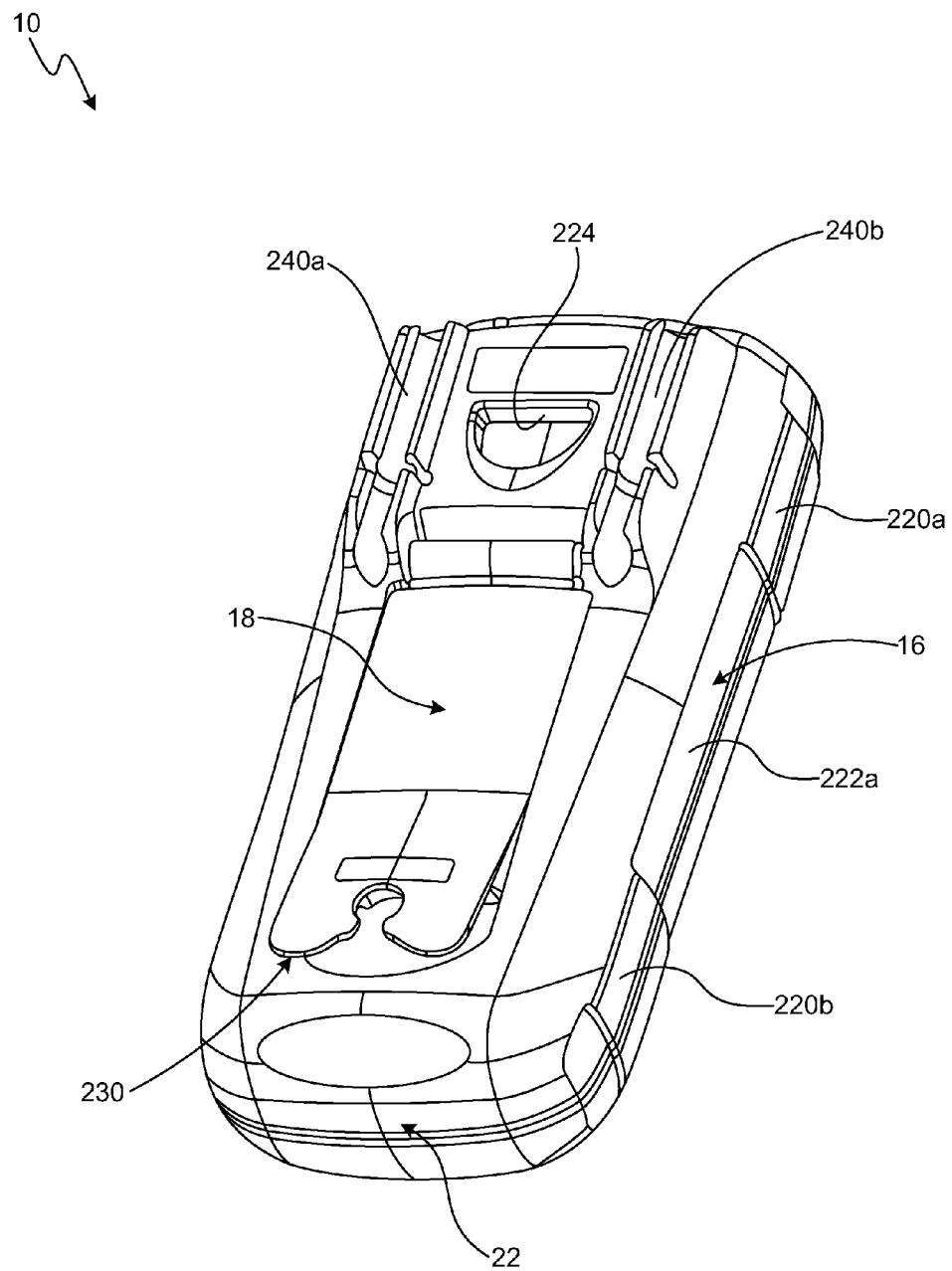
FIG. 8 is a second perspective view of the ruggedized DMM shown in FIG. 1.

FIGS. 7 and 8 provide perspective views of the ruggedized DMM 10. In particular, FIG. 7 shows a perspective view including the front side 12, the right-side 16, and the bottom 22. FIG. 8 shows a perspective view including the left-side 16, the back 18, and the bottom 22.

Figure 9:
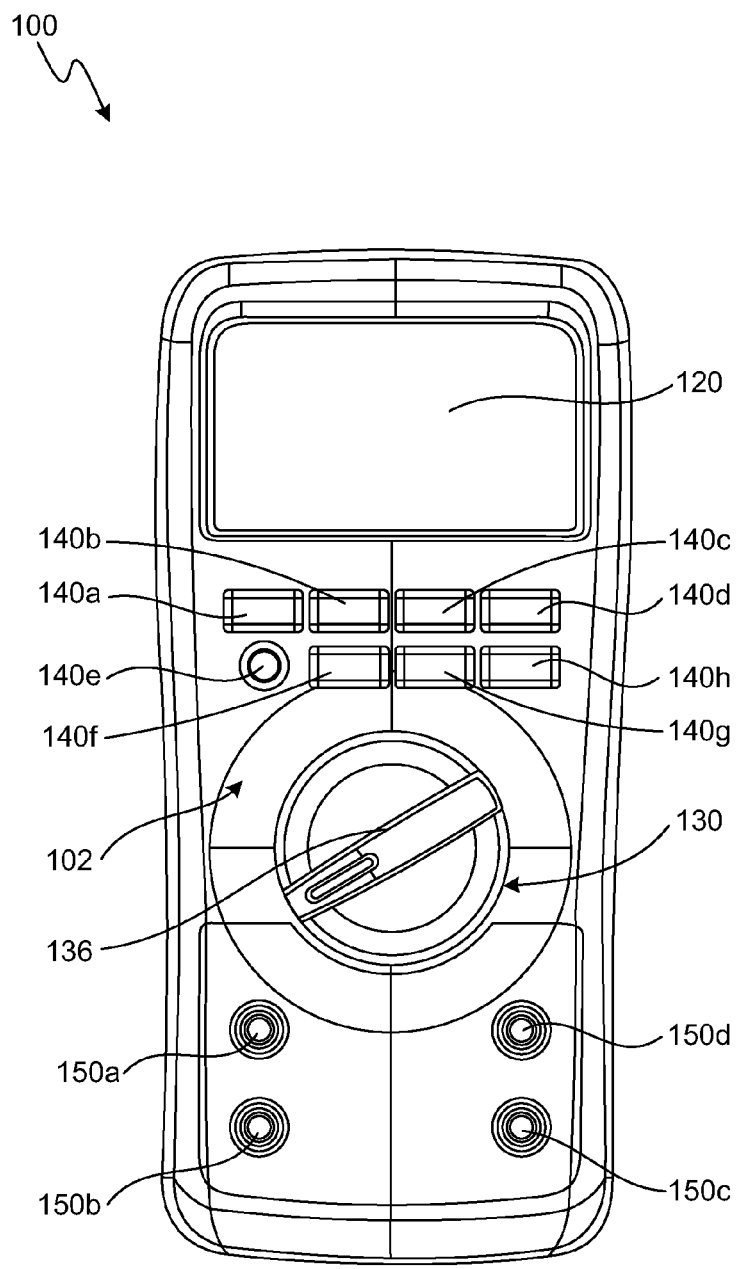
FIG. 9 is front elevation view of a DMM according to an embodiment of the present disclosure.
Figure 10:
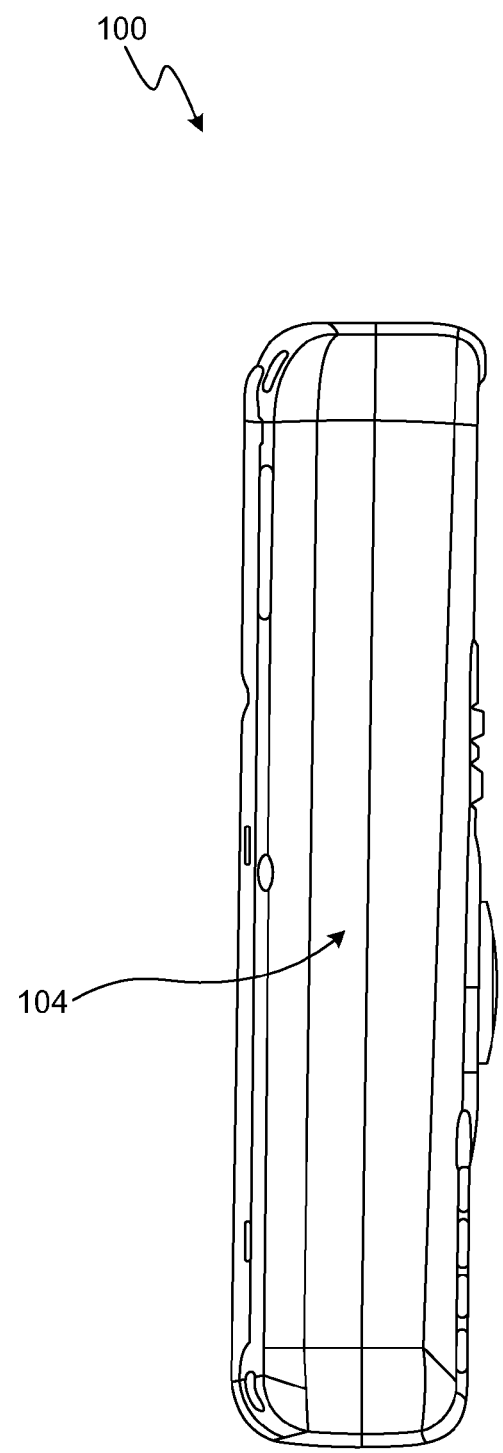
FIG. 10 is a left-side elevation view of the DMM shown in FIG. 9.
Figure 11:
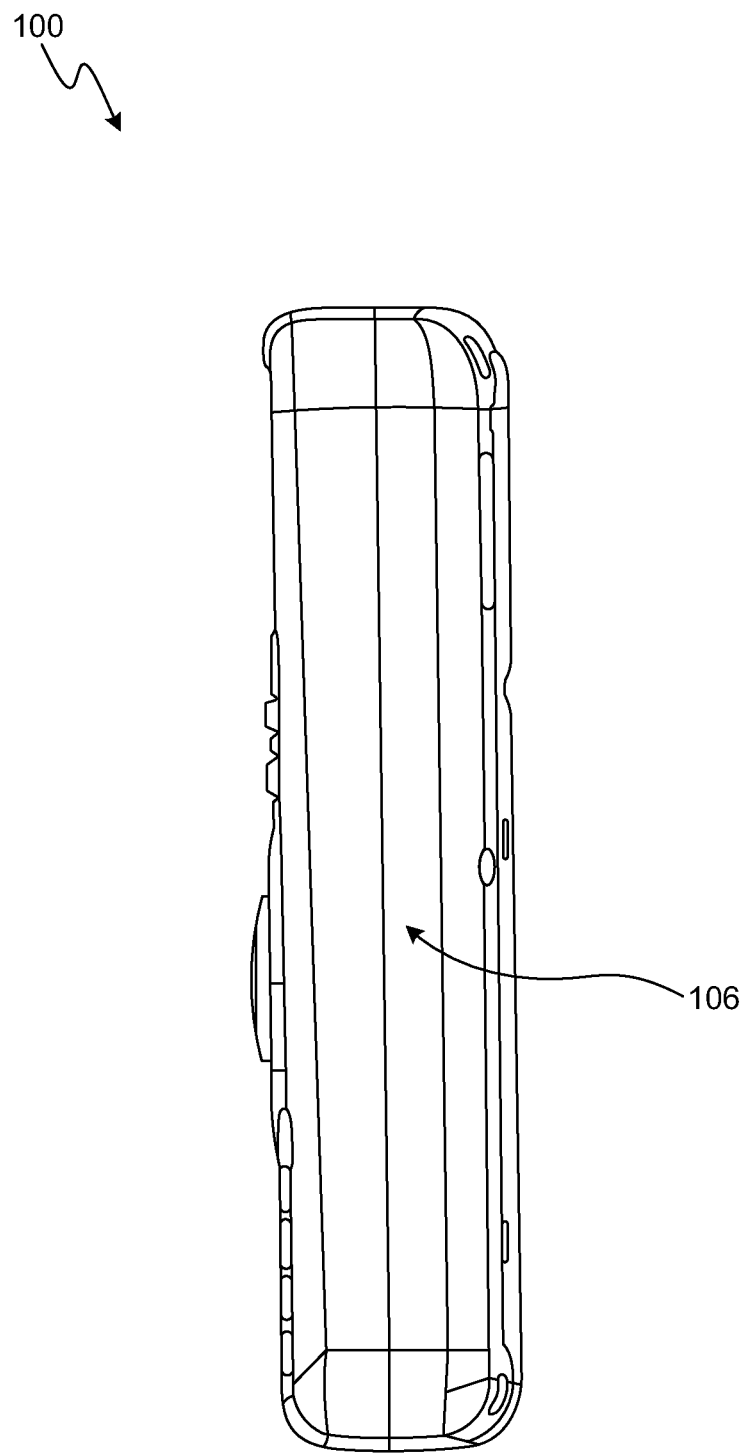
FIG. 11 is a right-side elevation view of the DMM shown in FIG. 9.
Figure 12:
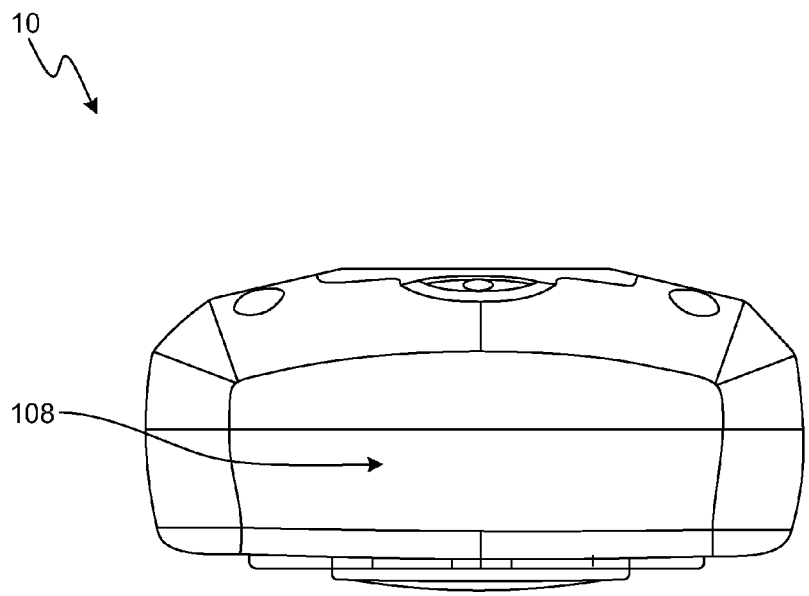
FIG. 12 is a top plan view of the DMM shown in FIG. 9.
Figure 13:
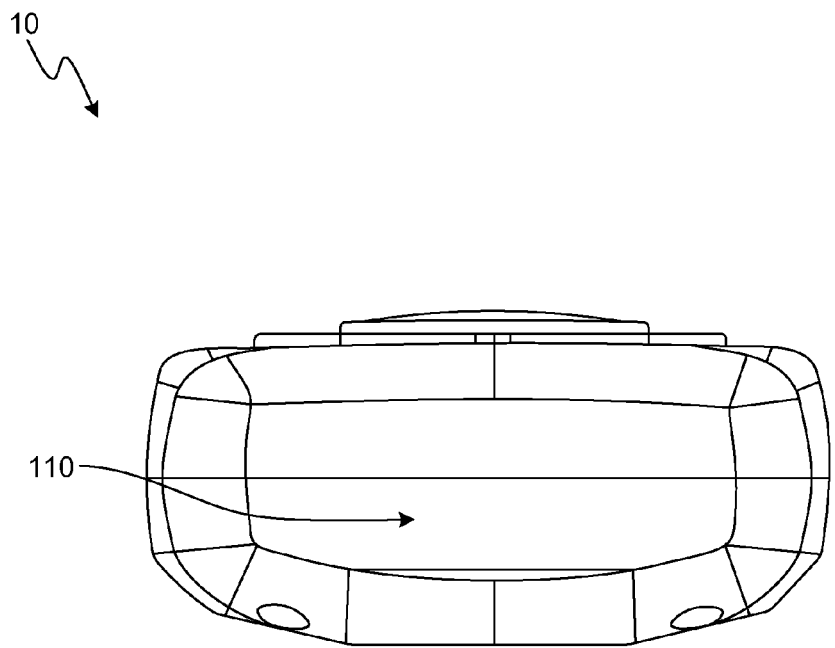
FIG. 13 is a bottom view of the DMM shown in FIG. 9.
Figure 14:
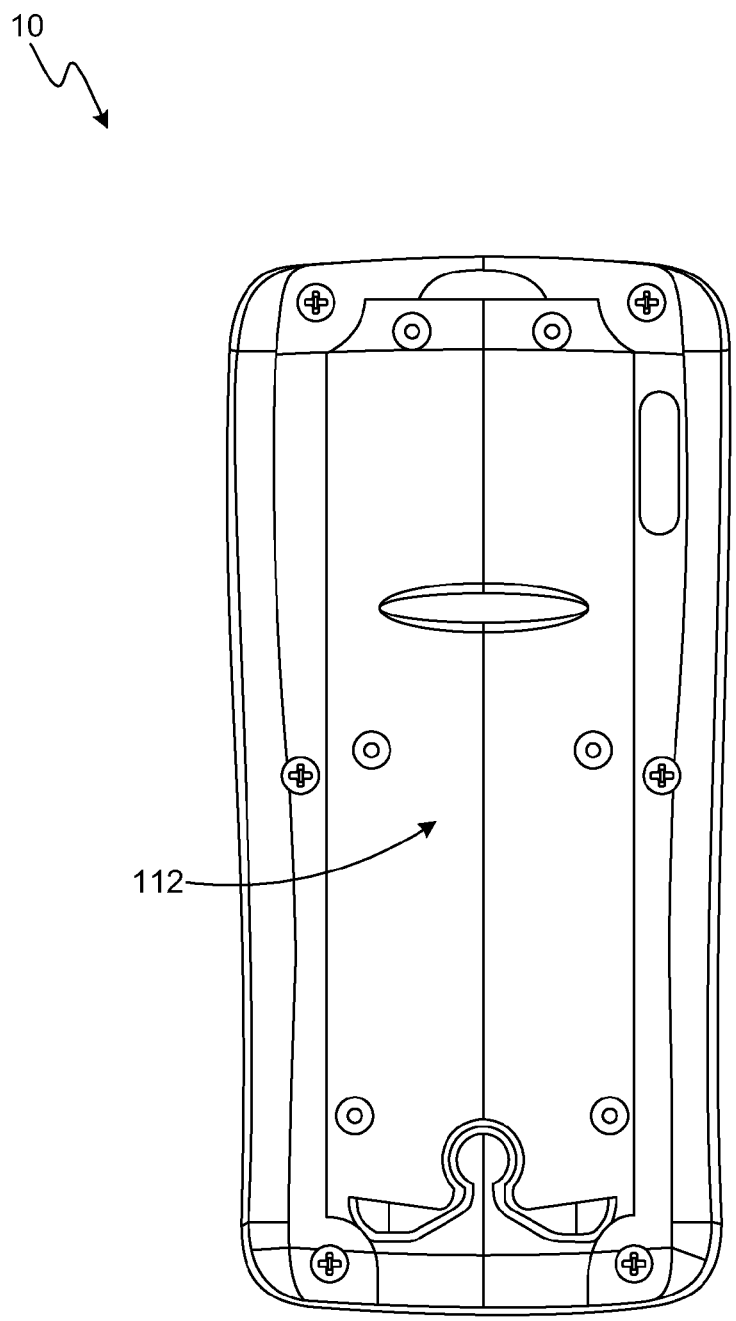
FIG. 14 is a back elevation view of the DMM shown in FIG. 9.

FIG. 9 is a front elevation view showing the front face 102 of the DMM 100 including the display 120, the rotary selector 130, the plurality of push buttons 140 (eight push buttons 140a-140h are shown in FIG. 9), and the plurality of jacks 150 (four jacks 150a-150d are shown in FIG. 9). The display 120 may show information such as the parameters that are measured by the DMM 100, one or more settings selected by the operator for the DMM 100, etc. The display 120 may include a liquid crystal display (LCD), a set of light emitting diodes (LEDs), or another device suitable for conveying information to the operator.

The rotary selector 130 may include a rotary selector switch 132 (FIG. 17), a knob 134 (FIG. 17) coupled to the rotary selector switch 132, and a cover 136 molded over the knob 134. Certain embodiments according to the present disclosure include a double molded knob 134 and cover 136. Specifically, the knob 134 may be molded with a relatively hard plastic such as acrylonitrile butadiene styrene (ABS) and the cover 136 may be over molded on the knob 134 with a relatively soft plastic such as Santoprene®. Accordingly, the knob 134 provides a relatively rigid form and the cover 136 provides an impact energy absorbing over layer so that the cover 136 may prevent fracturing the knob 134 if the ruggedized DMM 10 falls with the front face 12 oriented downward.

The push buttons 140 may include "smart" buttons to select settings for the DMM 100 that may be identified in the display 120 immediately above a corresponding push button 140. Accordingly, push buttons 140a-140d may select settings specific to a particular setting of the rotary selector switch 132. The push buttons 140 may also be used in connection with selecting global settings for the DMM 100. The push buttons 140e-140h may be used to activate or reset operation of the DMM 100.

The jacks 150 provide connections for test leads (not shown) to different functions of the DMM 100. For example, jack 150a may be for connecting a common test lead, i.e., used in conjunction with one or more the other jacks 150b-150d, and the jacks 150b-150d may be for connecting a second test lead used in conjunction with measuring one of resistance, voltage, current, etc.

Figure 15:
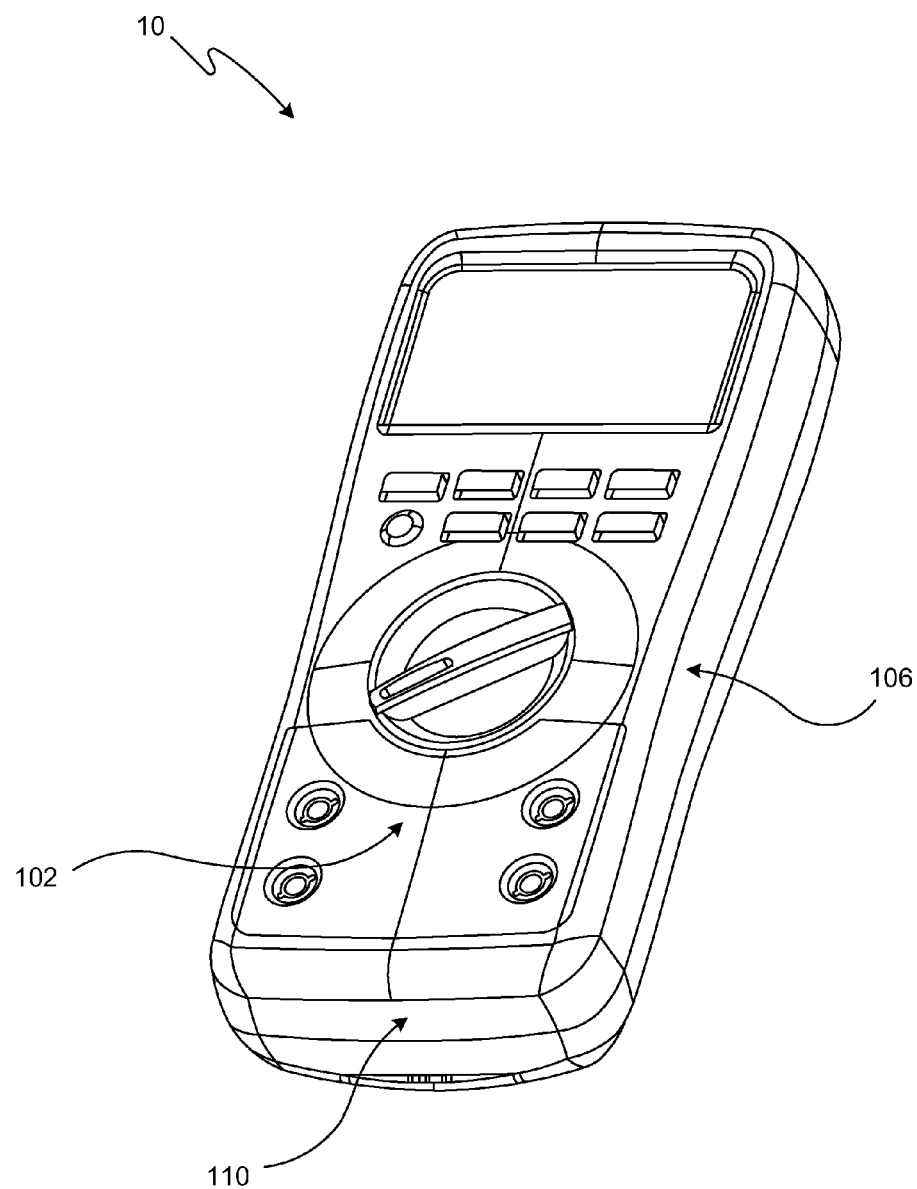
FIG. 15 is a first perspective view of the DMM shown in FIG. 9.
Figure 16:
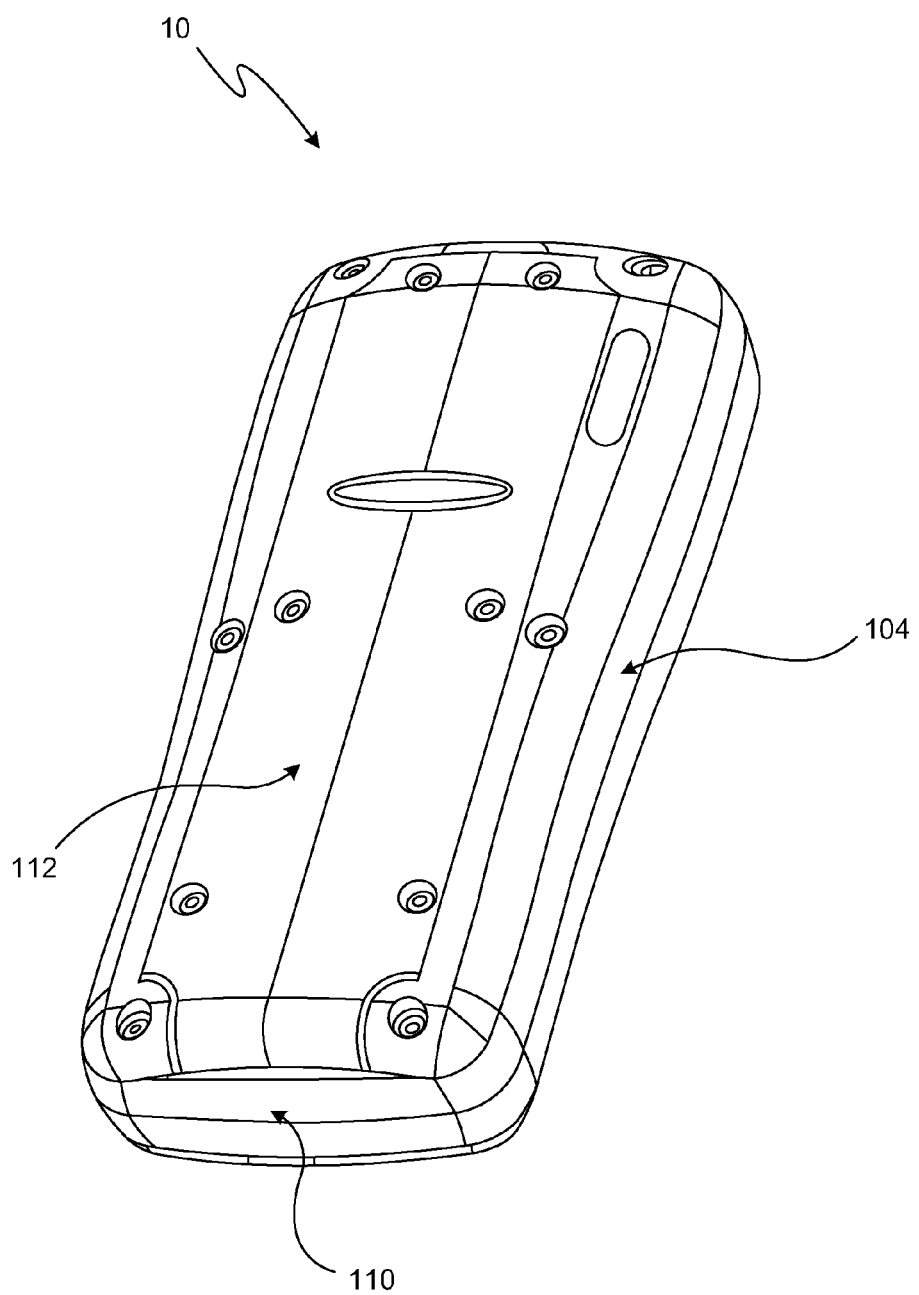
FIG. 16 is a second perspective view of the DMM shown in FIG. 9.

FIGS. 10-14 show a left-side 104 (FIG. 10), a right-side 106 (FIG. 11), a top 108 (FIG. 12), a bottom 110 (FIG. 13) and a back 112 (FIG. 14) of the DMM 100. FIGS. 15 and 16 provide perspective views of the DMM 100. In particular, FIG. 15 shows a perspective view including the front side 102, the right-side 106, and the bottom 110. FIG. 16 shows a perspective view including the left-side 104, the bottom 110, and the back 112.

Figure 17:
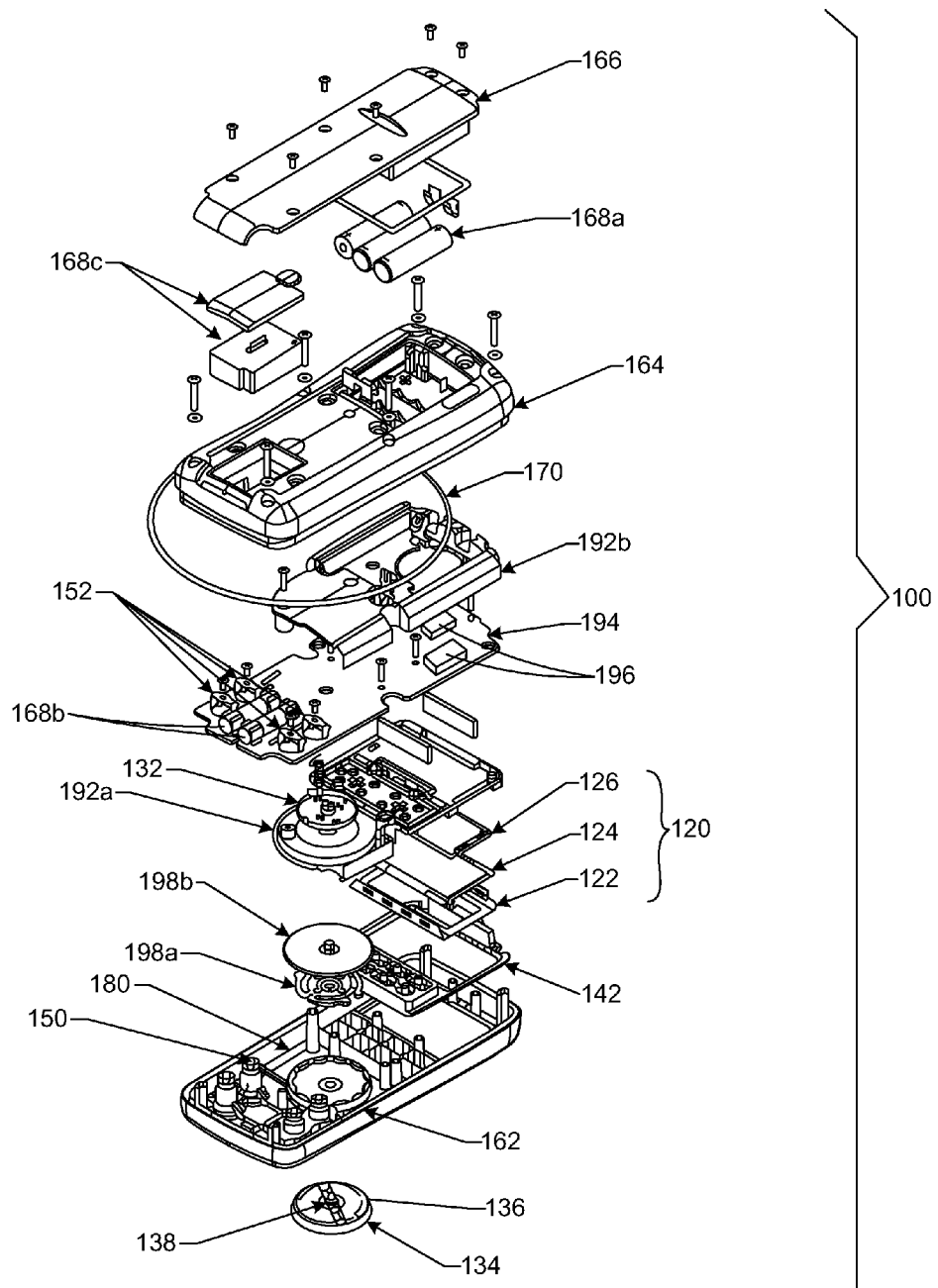
FIG. 17 is an exploded perspective view of the DMM shown in FIG. 9.

FIG. 17 is an exploded perspective view of an embodiment of the DMM 100 according to the present disclosure. The DMM 100 includes a housing assembly 160 including a top case 162 and a bottom case 164. The top case 162 may include the display 120, the rotary selector knob 134 and cover 136, a keypad 142 supporting the push buttons 140, and the jacks 150. Certain embodiments of the display 120 according to the present disclosure include an LCD mask 122, an LCD 124, and a backlight 126. In addition to over molding the cover 136 on a front side of the knob 134, a seal 138 may be over molded on a back side of the knob 134. The seal 138 may provide a fluid tight barrier between the knob 134 and the top case 162. The jacks 150 (only one is indicated in FIG. 17) may be hermetically sealed with respect to the top case 162 and respective electrical contacts 152 may conveying an electric signal from an external test lead (not shown) to inside the cavity 180.

The bottom case 164 may include a detachable door 166 through which operator replaceable components 168 (e.g., FIG. 17 shows batteries 168a and a fuse 168b) may be accessed. A secondary door 168c may cover the fuse 168b.

A gasket 170 may make fluid tight an interface between the top and bottom cases 162 and 164. Accordingly, the top case 162 (including, for example, the display 120, the knob 134, the seal 138, the keypad 142, and the jacks 150), the bottom case 164, and the gasket 170 form the housing assembly 160 that defines an internal cavity 180. The internal cavity 180 provides a buoyant chamber such that the DMM 100 may float toward the surface of a liquid such as water. Internal components 190 for measuring parameters may be disposed in the cavity 180. Certain embodiments according to the present disclosure have internal components 190 including shields 192 (a top shield 192a and a bottom shield 192b are shown in FIG. 17), a printed circuit board 194 supporting solid state circuitry 196, and rotary selector couplings 198 (a spring detent 198a and a spacer 198b are shown in FIG. 17).

The top and bottom cases 162 and 164 may include a relatively rigid material that resists deflection, e.g., having a hardness of at least approximately 65 Shore D. The top and bottom cases 162 and 164 may include, for example, ABS or another suitable thermoplastic resin.

FIGS. 18-25 show the jacket 200 separated from the DMM 100. In general, the jacket 200 has a concave arrangement with a lip 202 surrounding an opening 204. The lip 202 includes the brow 210 and the chin 212. The grips 220 and the depression 222 are included on the left-side (FIG. 19) and/or the right-side (FIG. 20) of the jacket 200. The aperture 224, the stand 230, the cable manager 232, the test lead holders 240a and 240b are included on the back (FIG. 23) of the jacket 200.

Figure 18:
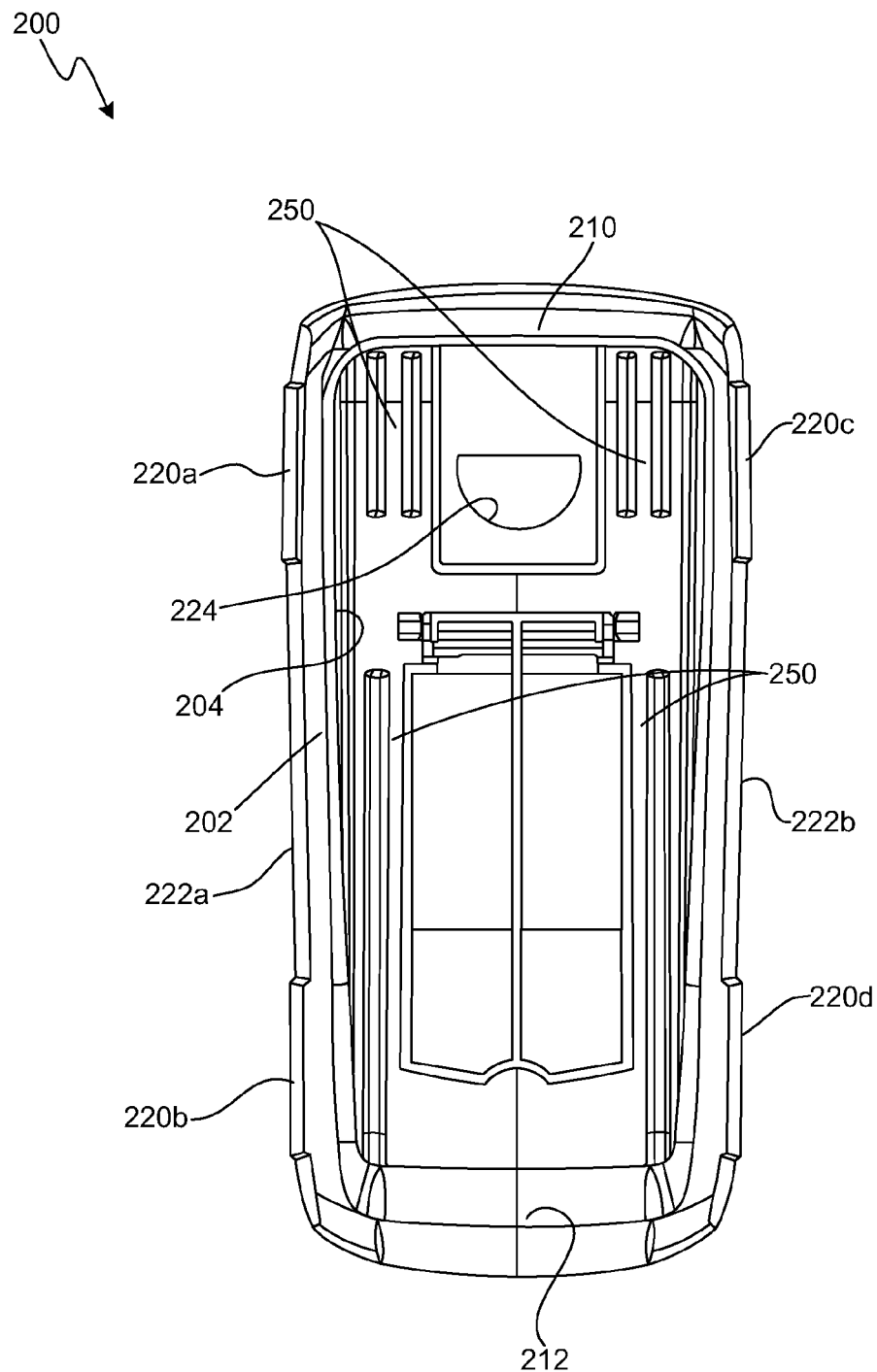
FIG. 18 is front elevation view of a jacket according to an embodiment of the present disclosure.
Figure 19:
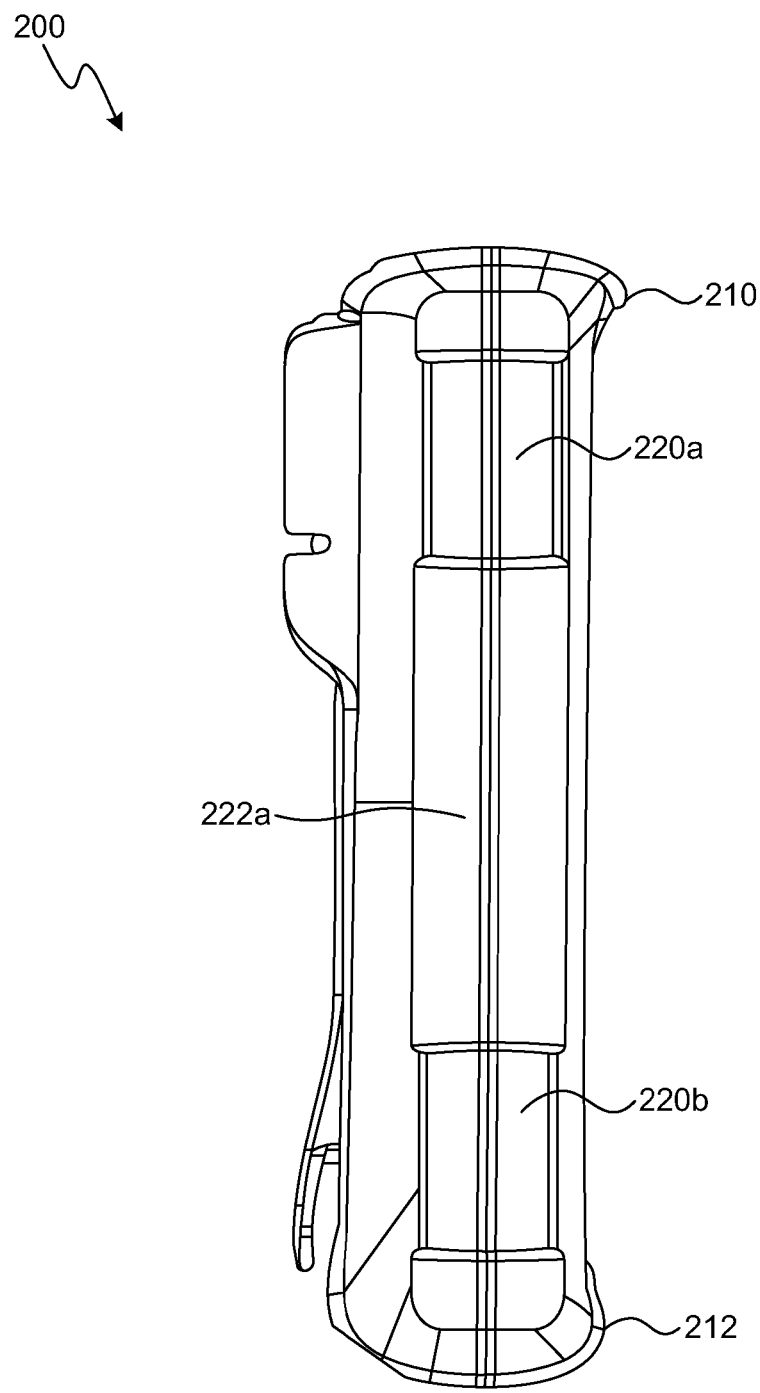
FIG. 19 is a left-side elevation view of the jacket shown in FIG. 18.
Figure 20:
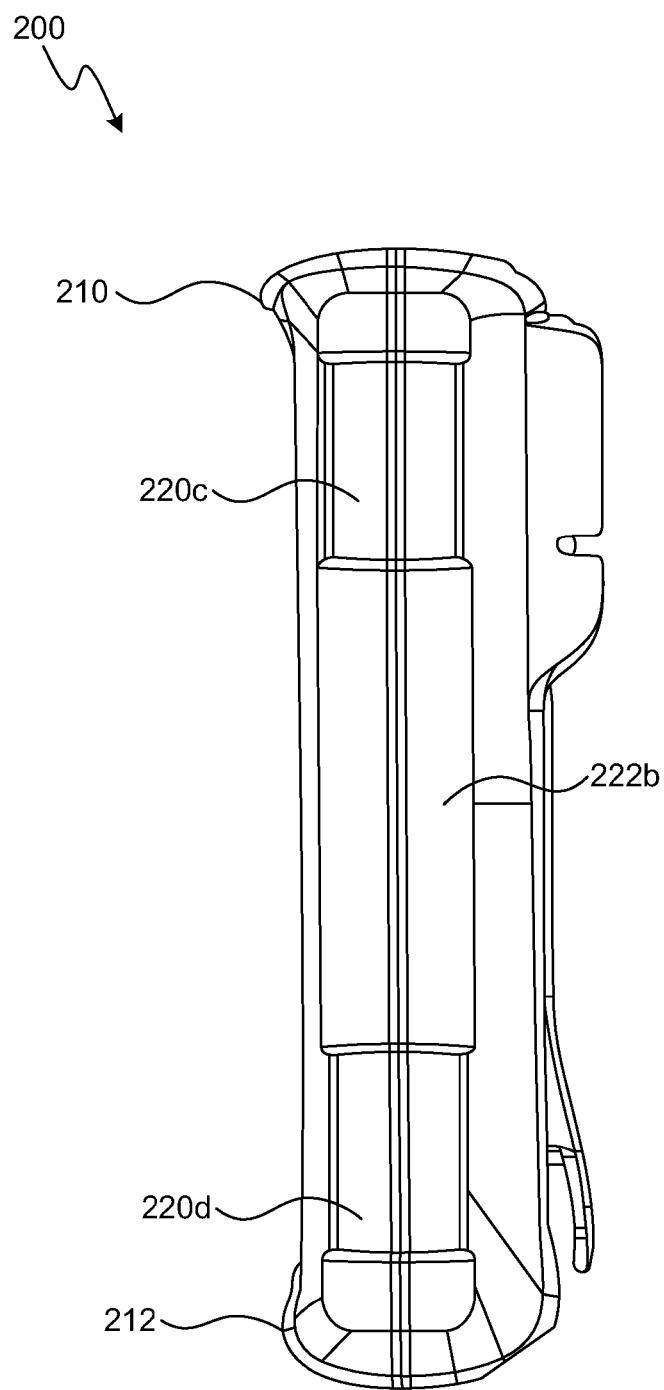
FIG. 20 is a right-side elevation view of the jacket shown in FIG. 18.
Figure 21:
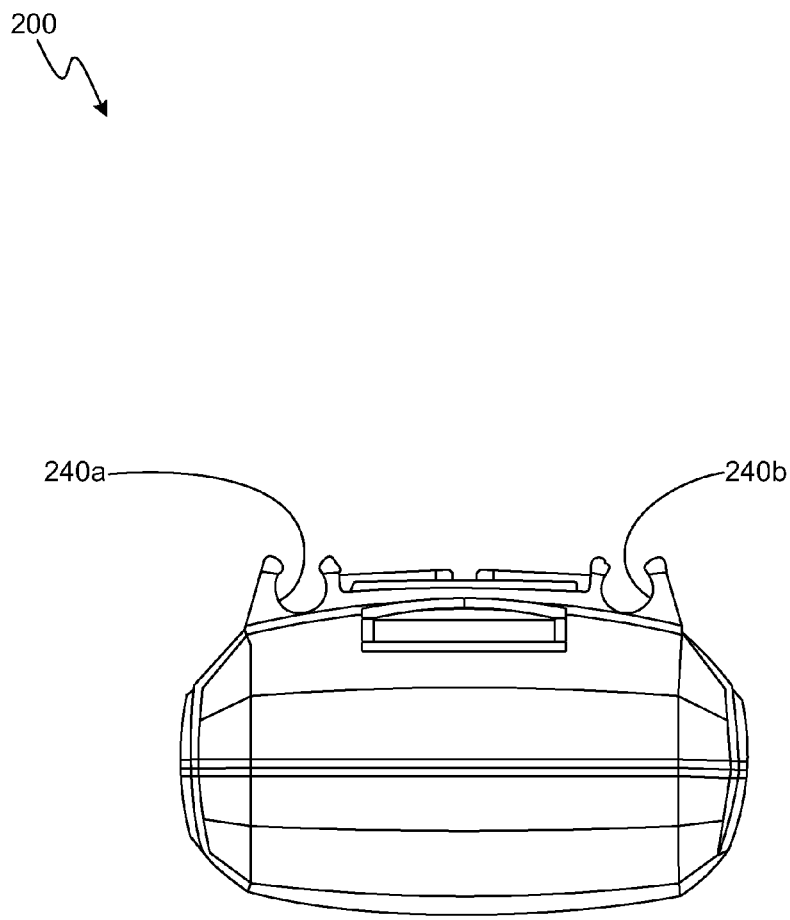
FIG. 21 is a top plan view of the jacket shown in FIG. 18.
Figure 22:
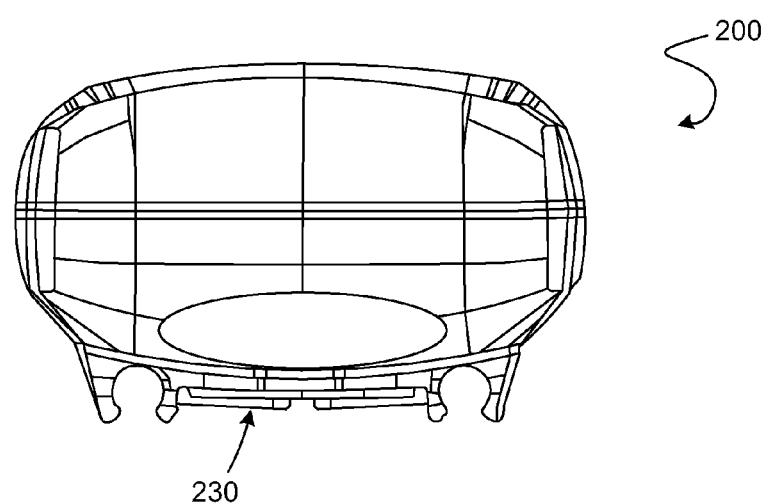
FIG. 22 is a bottom view of the jacket shown in FIG. 18.
Figure 23:
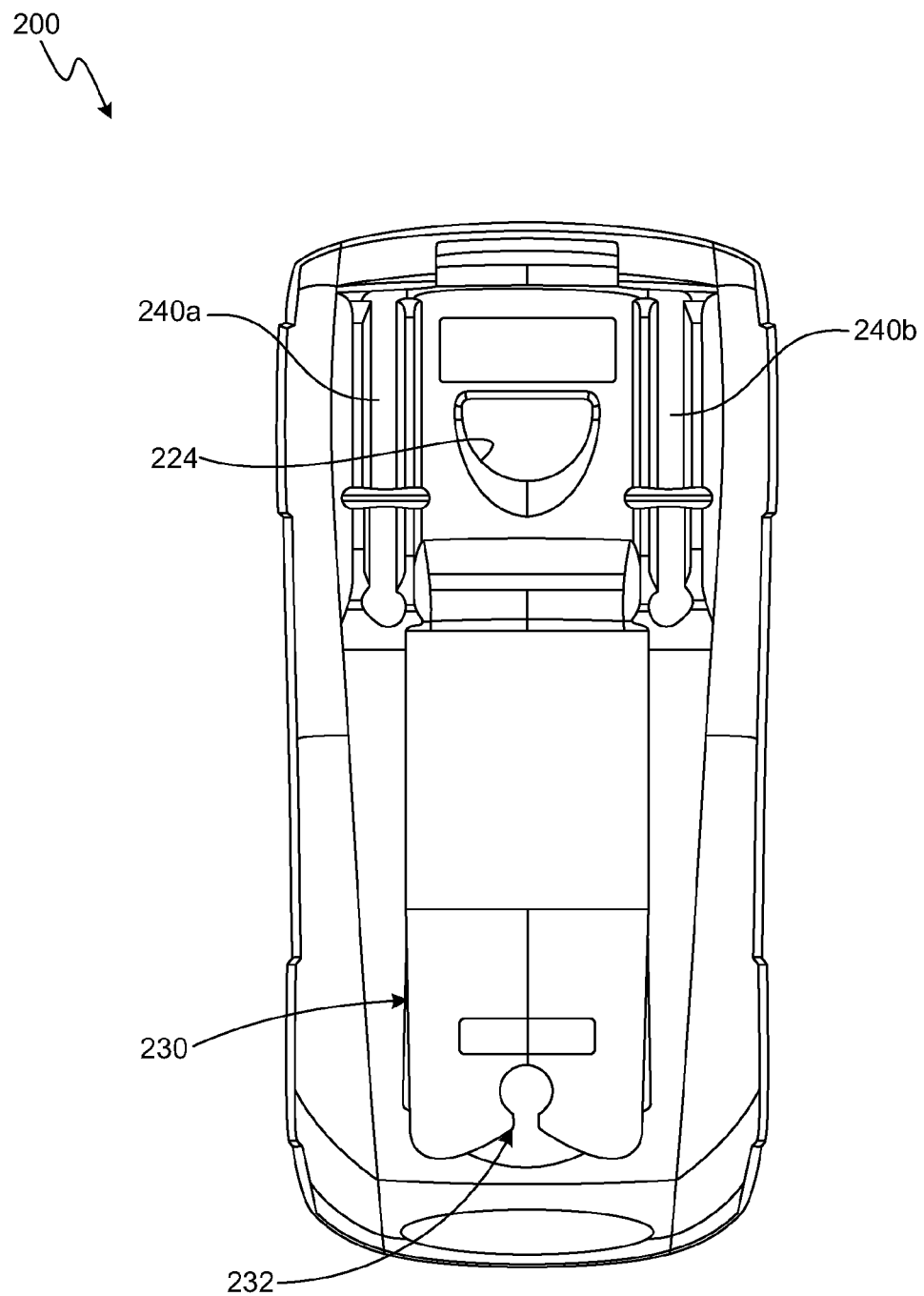
FIG. 23 is a back elevation view of the jacket shown in FIG. 18.
Figure 24:
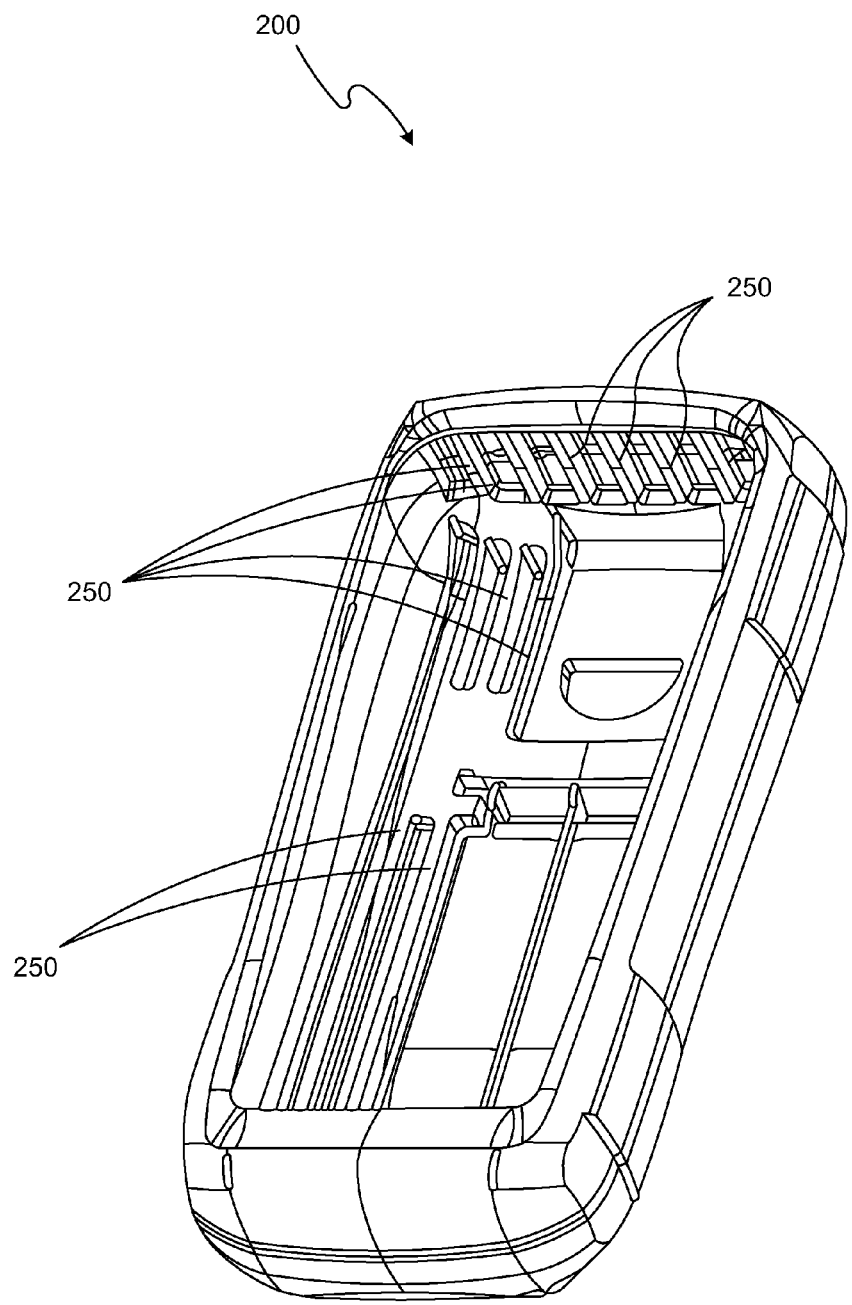
FIG. 24 is a first perspective view of the jacket shown in FIG. 18.
Figure 25:
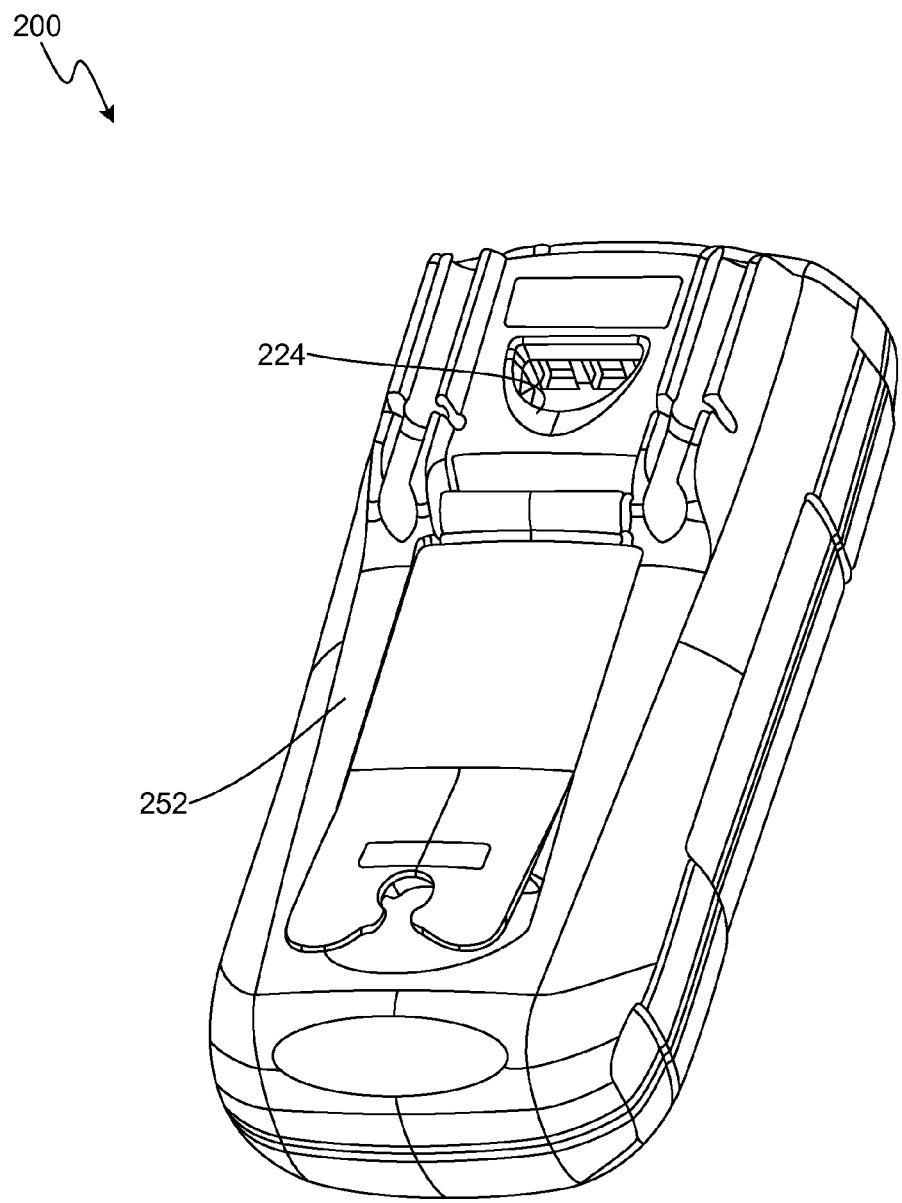
FIG. 25 is a second perspective view of the jacket shown in FIG. 18.

As best seen in FIGS. 18 and 24, the jacket 200 includes a plurality of spaced ribs 250 that absorb impact energy that for protecting the housing assembly 160. A skin 252 (FIG. 25) connecting the ribs 250 may be disposed between the ribs 250 and the DMM 100 (not shown) or the ribs 250 may be disposed between the skin 252 and the DMM 100.

The jacket 200 may include a relatively flexible material having that can be resiliently stretched over the DMM 100, e.g., having a hardness range from approximately 35 Shore A to approximately 45 Shore D. The jacket 200 may include, for example, Santoprene®, a mixture of an in-situ cross linked ethylene propylene diene Monomer (EPDM) rubber with polypropylene, or another suitable thermoplastic vulcanizate (TPV).

Certain embodiments according to the present disclosure can absorb impact energy in response to dropping the ruggedized DMM 10 up to approximately one meter onto a hard surface. Moreover, the jacket 200 and/or the gasket 170 protect against water and dust ingress into the cavity. Certain embodiments according to the present disclosure prevent water ingress into the cavity 180 in response to submerging the ruggedized DMM 10 under approximately one meter of water, and prevent dust ingress into the cavity 180. Certain embodiments of the jacket 200 according to the present disclosure may also be stable over a range of environmental conditions, are electrical insulators, and/or are liquid resistant.

Specific details of the embodiments of the present disclosure are set forth in the description and in the figures to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the present disclosure.

Unless the context clearly requires otherwise, throughout the description and the claims, the words "comprise", "comprising", and the like are to be construed in an inclusive sense, as opposed to an exclusive or exhaustive sense; that is to say, in the sense of including, but not limited to. Additionally, the words "herein", "above", "below", and words of similar connotation, when used in the present disclosure, shall refer to the present disclosure as a whole and not to any particular portions of the present disclosure. Where the context permits, words in the above Detailed Description using the singular or plural number may also include the plural or singular number respectively. The word "or", in reference to a list of two or more items, covers all of the following interpretations of the word: any of the items in the list, all of the items in the list, and any combination of the items in the list.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. A digital multimeter, comprising:
   a display configured to display a measured parameter;
   a selector configured to select the measured parameter, the selector including—
      a rotary selector switch, a knob coupled to the rotary selector switch, and a cover molded over the knob, wherein the cover includes a relatively soft material compared to the knob; and
      at least one push button;
   at least one jack configured to receive a test lead plug; and
   a housing assembly including the display, the selector and the jack, wherein the housing assembly includes—
      a first housing portion;
      a second housing portion configured to be coupled to the first housing portion;
      a gasket sealing the first and second housing portions; and
      a jacket overlying parts of the first housing portion, the second housing portion and the gasket;
      wherein the housing assembly defines an internal cavity and is configured to (a) absorb impact energy in response to dropping the digital multimeter up to approximately one meter and (b) protect against water and dust ingress into the cavity.

2. The digital multimeter of claim 1, wherein the jacket is separable from first and second housing portions, the first and second housing portions comprise acrylonitrile butadiene styrene and the jacket comprises Santoprene®.

3. A multimeter, comprising:
   a display configured to display a measured parameter;
   a selector configured to select the measured parameter;
   a housing including the display and the selector; and
   a jacket overlying at least a portion of the housing, the jacket being separable from the housing, wherein the jacket comprises a back side comprising a plurality of spaced ribs connected by an exterior skin, wherein the ribs are aligned lengthwise, and the ribs separate a back of the housing from the exterior skin.

4. The multimeter of claim 3, wherein the housing comprises a thermoplastic resin having a first hardness of at least approximately 65 Shore D and the jacket comprises a thermoplastic vulcanizate having a second hardness of approximately Shore A 15 to approximately Shore D 45.

5. The multimeter of claim 3, wherein the housing comprises acrylonitrile butadiene styrene and the jacket comprises Santoprene®.

6. The multimeter of claim 3, wherein the selector comprises a rotary selector switch, a knob coupled to the rotary selector switch, and a cover molded over the knob, wherein the cover includes a relatively soft material compared to the knob.

7. A multimeter, comprising:
   a display configured to display a measured parameter;
   a selector configured to select the measured parameter;
   a housing including the display and the selector, the housing enclosing a cavity and having a surface configured to resist deflection; and
   a jacket resiliently stretched over the housing, wherein the jacket comprises a back side comprising a plurality of spaced ribs connected by an exterior skin, wherein the ribs are aligned lengthwise, and the ribs separate a back of the housing from the exterior skin.

8. The multimeter of claim 7, wherein the jacket comprises a ridge projecting outward from the housing.

9. The multimeter of claim 8, wherein the ridge comprises a brow above the display.

10. The multimeter of claim 7, wherein the ribs are disposed between the skin and the housing.

11. The multimeter of claim 7, wherein the housing comprises a face including the display and the selector, and the jacket comprises an opening surrounding the face.

12. The multimeter of claim 7, wherein the jacket comprises:
   a concave arrangement having a front face and a back face with a pair of lateral sides disposed about and extending between the front and back face defining a plurality of grips and depressions laterally disposed about the housing, the front face having a lip and a chin projecting outward from the front face, the back face defining a pair of holders for holding test leads of the multimeter; and
   the jacket has a hardness ranging from 35 Shore A to approximately 45 Shore D.

13. A multimeter, comprising:

a display configured to display a measured parameter;

a selector configured to select the measured parameter;

a housing assembly including the display and the selector, the housing assembly having a first housing portion, a second housing portion configured to be coupled to the first housing portion, and a gasket sealing the first and second housing portions wherein the housing assembly defines an internal cavity; and a jacket resiliently stretched over the housing, the jacket being separable from the housing, wherein the jacket comprises a back side comprising a plurality of spaced ribs connected by an exterior skin, wherein the ribs are aligned lengthwise, and the ribs separate a back of the housing from the exterior skin.

14. The multimeter of claim 13, wherein the housing assembly prevents dust and water ingress into the cavity.

15. The multimeter of claim 13, wherein the cavity defines a buoyant chamber configured to float the multimeter.

16. The multimeter of claim 14, wherein the jacket is configured to prevent at least one of: (i) fracturing the housing assembly in response to dropping the multimeter up to approximately one meter; or (ii) prevent water ingress into the cavity in response to submerging the multimeter under approximately one meter of water.

17. The multimeter of claim 13 further comprising at least one of a printed circuit board and solid state electronics being disposed in the cavity.

18. The multimeter of claim 13, wherein the housing assembly further includes at least one test lead jack.

19. The multimeter of claim 13, wherein the housing assembly further includes at least one push button.

\* \* \* \* \*